United States Patent [19]

Carroll et al.

[11] Patent Number: 5,296,413
[45] Date of Patent: Mar. 22, 1994

[54] AUTOMOTIVE GLASS THICK FILM CONDUCTOR PASTE

[75] Inventors: Alan F. Carroll, Raleigh, N.C.; Hideaki Kuno, Kanagawa, Japan

[73] Assignee: E. I. Du Pont de Nemours and Company, Wilmington, Del.

[21] Appl. No.: 847,340

[22] Filed: Mar. 6, 1992

Related U.S. Application Data

[63] Continuation-in-part of Ser. No. 801,918, Dec. 3, 1991.

[51] Int. Cl.$^5$ ................................................ C03C 8/22
[52] U.S. Cl. ............................................. 501/19; 501/17; 501/32; 501/16; 106/1.13; 106/1.14
[58] Field of Search ............... 106/1.13, 1.14; 501/17, 501/19, 32, 16

[56] References Cited

U.S. PATENT DOCUMENTS

| | | | |
|---|---|---|---|
| 3,775,154 | 11/1973 | Grego et al. | 117/38 |
| 3,844,796 | 10/1974 | Jasinski | 106/52 |
| 4,098,949 | 7/1978 | Kosiorek | 106/1.14 |
| 4,446,059 | 5/1984 | Eustice | 252/514 |
| 4,623,389 | 11/1986 | Donley et al. | 106/1.14 |
| 4,728,781 | 3/1988 | Donley et al. | 219/547 |
| 4,939,090 | 9/1990 | Reinherz | 106/1.14 |

FOREIGN PATENT DOCUMENTS

| | | |
|---|---|---|
| 0008782 | 3/1980 | European Pat. Off. . |
| 0466344 | 1/1992 | European Pat. Off. . |
| 1957622 | 5/1971 | Fed. Rep. of Germany . |
| 2580626 | 4/1986 | France . |
| 53-33752 | 9/1978 | Japan . |
| 57-21084 | 5/1982 | Japan . |
| 242441 | 9/1989 | Japan . |
| 1-258303 | 10/1989 | Japan . |
| 1-258304 | 10/1989 | Japan . |
| 1-258305 | 10/1989 | Japan . |

OTHER PUBLICATIONS

Chemical Abstracts, vol. 112, No. 14, Apr. 2, 1990, Abstract Nos. 120352u, 120353v, 120354w, p. 69.
Derwent Publications Ltd., London, GB, Week 7714, AN 77-24294Y Feb. 22, 1977.
Derwent Publications Ltd., London, GB, Week 7841, AN 78-73833A Sep. 16, 1978.

*Primary Examiner*—Mark L. Bell
*Assistant Examiner*—C. M. Bonnar

[57] ABSTRACT

Thick film paste composition for applying conductive patterns to automotive window glass comprising finely divided particles of metallic silver, glass frit, and selected transition metal oxides, all of the particulate solids being dispersed in an organic medium.

2 Claims, No Drawings

AUTOMOTIVE GLASS THICK FILM CONDUCTOR PASTE

CROSS-REFERENCE TO RELATED APPLICATION

This application is a continuation-in-part of applicants' copending U.S. patent application Ser. No. 07/801,918 filed Dec. 3, 1991.

FIELD OF INVENTION

The invention relates to a thick film conductor pastes and particularly to thick film conductor compositions for use as automotive window defoggers.

BACKGROUND OF THE INVENTION

In recent years automobile manufacturers have offered as optional equipment rear windows which can be defrosted and/or defogged by use of an electrically conductive grid permanently attached to the window. In order to defrost quickly, the circuit must be capable of supplying large amounts of power from a low voltage power source, for example 12 volts. Furthermore, the lines of the conductive grid must be sufficiently narrow in order to maintain visibility through the rear window.

The resistance requirements of conductive patterns is on the order of 2 to 15 milliohms per square, which requirements are easily met by noble metal conductors, particularly silver, which is currently the most widely used conductor material in this application.

Heretofore, the materials used for the preparation of window defogging grids have mostly been thick film silver conductors which are prepared from paste comprising finely divided silver powder particles and glass frit dispersed in an organic medium. In a typical application, a paste containing by weight 70% silver powder, 5% glass frit and 25% organic medium is screen printed through a 180 Standard Mesh Screen onto a flat, unformed glass rear window. The printed composition is dried for at least 2 minutes at about 150 C. and the entire element is then fired in air from 2 to 5 minutes at 650 C. After firing the softened glass is shaped by pressing into a mold and then tempered by rapidly cooling. During the firing cycle the organic medium is removed by evaporation and pyrolysis. The glass and silver are sintered to form a continuous conductive path with the glass acting as binder for the silver particles.

In the manufacture of automotive defoggers, an important criterion has been the appearance of the interface between the glass and conductor pattern—particularly color. By far the most predominant type of glass used in the manufacture of automotive windows is soda-lime glass made by the float glass process in which the molten soda-lime glass is cast upon a long pool of molten tin or tin alloy in a controlled atmosphere. This process produces a glass of nearly perfect flatness and excellent thickness uniformity without the necessity of grinding and polishing. During the float glass process a small amount of tin diffuses into the glass from the bath. This leaves no visible image on the surface of the glass. However, the tin diffusion results in different chemical interactions of the glass with staining metals such as silver and copper and the glass surface is harder.

When silver is used as a conductive material, a naturally dark brown color is produced at the glass-conductor interface even without the addition of colorants when the conductor is printed on the "tin side" of the glass, i.e. on the the side of the glass which was next to the tin in the float process.

In the manufacturing process, it would be preferred to print the conductor on the air side of the glass in order to avoid certain handling difficulties. For example, less yield loss would be incurred from mechanical damage to the glass surface and enamel color could be better controlled. However, when the conductor is printed on the "air side" of the glass. i.e. on the side exposed to the atmosphere, little color development takes place. For this reason, the automotive glass industry usually prints silver paste onto the tin side of float glass after printing an enamel border on the glass. Consequently, formulations of thick film pastes for this use have contained various coloring agents so that they can be printed on the air side of the glass with suitable color development.

Frequently used colorants for printing on the air side have been silver salts such as $Ag_2SO_4$ and $Ag_2S$, which upon firing take part in ion exchange reactions with components of the glass substrate to form particles of silver at the interface between the substrate and the conductor composition printed thereon. Conductor patterns made by this method do, however, have several disadvantages.

(1) Colorants of the above-described kind have to be used in substantial concentrations in order to get adequate color development:
(2) When substantial concentrations of such colorants are used, the surface is considerably less solderable because it is inadequately wetted by the solder;
(3) Frequently, a transparent yellow color is formed in the areas adjacent to the lines because of the reduction of silver ions:
(4) These particles then form colored agglomerates of Ag by ion exchange with the glass, thereby producing a mobile salt species. After prolonged humid storage, the mobile salt species, such as $Na_2SO_4$, forms a salt scale on the silver surface; and
(5) The colors developed by the above-described method tend to change upon firing.

The invention is therefore directed at reducing the impact of the above referred problems on air-side patterning in the manufacture of automotive window glass.

SUMMARY OF THE PRIOR ART

U.S. Pat. No. 3,775,154, Grego et al

The reference is directed to a decorative color composition which is sprayed as a liquid or applied as a paste onto crystallizable glass and then fired at 1085 C. to achieve both coloration and ceramming of the glass. The composition contains 5–15% wt. silver compounds, 5–15% wt. elemental sulfur, 40–80% compounds of Fe, Mn, Ni, V, Cr, Ti or Co and 5–10% wt. inorganic binder such as bentonite. The silver is said to improve surface quality of the decoration. The sulfur acts to prevent premature reduction of the silver compounds during the firing process by the formation of refractory silver sulfides. The silver ions are then reduced to the univalent state within the glass by ion exchange. The bentonite is said to function as a green strength additive and as a binder for the fired composition.

U.S. Pat. No. 3,844,796, Jasinski

The reference is directed to making colored glasses using a mixture of $MnO_2$ and $K_2Cr_2O_7$ as coloring agents. In particular, it is disclosed that $Mn^{-2}$ is a weak colorant giving a brownish color and $Mn^{+6}$ is a powerful colorant giving a purple color. The function of the hexavalent chromium, a strong oxidizing agent, is to maintain the manganese in the valence state which gives maximum coloring power.

U.S. Pat. No. 4,446,059, Eustice

The reference is directed to a thick film paste conductor composition for air side firing comprising finely divided particles of (a) conductive metal, (b) inorganic binder and (c) a colorant which is a mixture of silver oxide and/or copper oxide or precursor thereof and $B_2O_3$.

U.S. Pat. No. 4,623,389, Donley et al

The reference is directed to compositions for heated automobile backlights having a dark color comprising silver powder, lead borosilicate glass frit and silver ion reducing agents which are either divalent tin compounds, such as stannous sulfate, or trivalent chromium compounds, such as chromic oxide.

SUMMARY OF THE INVENTION

The invention is directed to a thick film paste composition for applying conductive patterns to automotive window glass comprising an admixture of finely divided particles of (a) metallic silver, (b) glass frit having a softening point of 350–620 C.; and (c) 1–10% wt. basis paste, of an oxide of a transition metal selected from V, Mn, Fe, Co and mixtures thereof, all of (a), (b) and (c) being dispersed in (d) an organic medium, with the proviso that the valence of transition metal is higher than 2+

In a second aspect, the invention is directed to a method for applying conductor patterns to the air side of float glass comprising:
(1) screen printing a pattern of the above-described thick film paste onto the air side surface of the glass; and
(2) firing the glass and thick film pattern at 580–680 C. to effect volatilization of the organic medium from the thick film paste and liquid phase sintering of the silver particles.

DETAILED DESCRIPTION OF THE INVENTION

A. Conductive Metal

Either flake or powdered silver can be used in the practice of the invention. The particle size of the silver is not by itself narrowly critical from the standpoint of technical effectiveness. However, particle size does affect the sintering characteristics of the silver in that large particles sinter at a lower rate than small particles. In addition, the silver particles must be of a size appropriate to the method of application, which is usually screen printing. The particles of silver should therefore be no larger than 10 microns in size and preferably no larger than 5 microns. The minimum particle size is normally about 0. I micron. Silver particles larger than 1. 0 micron impart greater coloring power to the paste. Therefore, it is preferred that the compositions of the invention contain at least 50% wt. silver particles larger than 1.0 micron.

The silver will ordinarily be of high purity (99+%). However, less pure materials can be used with due consideration for the electrical requirements of the pattern. The amount of silver in the composition will usually be 60–99% wt., on a solids basis excluding the liquid organic medium. It will be 50–90% wt. on a paste basis.

B. Inorganic Binder

As indicated above, the inorganic binder for the compositions of the invention is a glass frit having a softening point of 350–620 C. in order that the compositions can be fired at 580–680 C. to effect proper sintering, wetting and adhesion to the glass substrate.

The chemical composition of the glass frit binder is not critical with respect to the functionality of the invention Lead borosilicate is used extensively in automotive glass pastes and it can also be used in the practice of the invention. Lead silicate and lead borosilicate glasses are excellent from the standpoint of both softening point range and glass adhesion. It is preferred to use low borate glasses, i.e. those having no more than about 20% wt. $B_2O_3$. Such low borate glasses will often contain 60–80% PbO as well as minor amounts of other glass tonners and modifiers. Either reducing or non-reducing glasses can be used.

It has been found that mixtures of high and low melting frits can be used to control the sintering characteristics of the silver particles. In particular, it is believed that the high temperature frit dissolves in the lower melting frit and together they slow the sintering rate of the silver particles as compared to silver pastes containing only low melting frit. This control of the sintering characteristics of the silver is especially advantageous when the composition is printed and fired over decorative enamels. (Decorative enamels are normally pastes comprised of one or more pigment oxides and opacifiers and glass frit dispersed in an organic medium.) A high melting frit is considered to be one having a softening point above 500° C. and a low melting frit is considered to be one having a softening point below 500° C. The difference in the melting temperatures of the high and low melting frits should be at least 100° C. and preferably at least 150° C. Mixtures of three or more frits having different melting temperatures can be used as well. When mixtures of high and low melting frits are used in the invention, they are normally used in ratios by weight from 4/1 to ¼.

The total amount of inorganic binder in the composition will ordinarily be from 1 to 200/% wt. of the solids portion of the composition and preferably from 1 to 10% wt.

As used herein, the term "Softening Point" refers to softening temperatures obtained by the fiber elongation method of ASTM C338-57.

C. Transition Metal Oxide

The use of transition metal oxides in addition to those contained in the glass frit is optional in the practice of the invention in order to provide coloration of the transition metal oxides in the glass frit. Suitable oxides are those of the transition metals V, Mn, Fe and Co. Normally at least 1.0% wt. of such metal oxides, basis paste, is needed to get a significant coloring effect, at least 2.0% wt. being preferred. Mixtures of the separately added (additive) transition metal oxides can, of course, be used as well. It is, however, preferred to use no more than 10% wt. and preferably no more than 6% wt., basis paste, of the additive transition metal oxides to avoid excessive modification of the properties of the sintered inorganic binder system. It is especially preferred to minimize the amount of additive transition metal oxides in order to retain a high level of soldered adhesion of the fired conductor layers to the glass substrate. Nevertheless, these metal oxides are particularly advantageous in this role because, unlike the salts frequently used in prior practice, they do not interact with float glass to form water soluble $Na_2SO_4$. Vanadium oxide is preferred.

It will be noted from the data in the Examples that transition metal oxides exhibit different effects on the properties of the fired conductive pastes when they are used in compositions of the invention. For example, the addition of manganese oxides tends to increase resistance markedly, but is a most effective colorant and the final paste has good solder adhesion. On the other hand, the addition of cobalt oxides increases resistance only moderately and they are very effective colorants. However, the fired pastes have lower solder adhesion. Similarly to $TiO_2$, the addition of vanadium oxides increased resistance least of all the oxides. Though somewhat sensitive to firing temperature, it is nevertheless a very effective colorant. Furthermore, the sensitivity Of $V_2O_5$ to the firing temperature of such pastes can be reduced by the low level addition Of $CO_3O_4$ to the paste. Furthermore, the addition of iron oxides increases resistance only moderately and the fired pastes have good solder adhesion, but their color enhancement is not as pronounced as either the Mn, Co or V oxides. Because of these differences in the fired paste properties, it is often preferred to use mixtures of the oxides in order properly to balance the color, resistance and soldering properties of the fired pastes.

Like the conductive phase, the particle size of the transition metal oxides, when they are added separately, is not narrowly critical from the standpoint of their technical effectiveness. However, they should be of a size appropriate to the manner in which they are applied and fired.

In addition to the transition metal oxides, a small amount of dark inorganic pigment can be added to enhance the color of the fired composition. However, no more than about 5% wt., basis total solids, should be used to avoid significant changes in the functional properties of the silver and the glass frit. Copper chromite and chromium oxide have been found useful for this purpose. Other dark inorganic pigments can be used as well.

D. Organic Medium

The metallizations of the invention will ordinarily be formed into paste which is capable of being printed in a desired circuit pattern.

Any suitably inert liquid can be used as organic medium (vehicle), nonaqueous inert liquids being preferred. Any one of various organic liquids with or without thickening agents, stabilizing agents and/or other common additives can be used. Exemplary of the organic liquids which can be used are alcohols, esters of such alcohols such as the acetates and propionates, terpenes such as pine oil, terpineol and the like, solutions of resins such as polymethacrylates or solutions of ethyl cellulose in solvents such as pine oil and monobutyl ether of ethylene glycol monoacetate. The medium can also contain volatile liquids to promote fast setting after printing to the substrate.

A preferred organic medium is based on a combination of a thickener consisting of ethyl cellulose in terpineol (ratio 1 to 9), combined with butyl Carbitol acetate. The pastes are conveniently prepared on a three-roll mill. A preferred viscosity for these compositions is approximately 30–100 Pa.S measured on a Brookfield HBT viscometer using a #5 spindle at 10 rpm and 25° C. The amount of thickener utilized is determined by the final desired formulation viscosity, which, in turn, is determined by the printing requirements of the system.

The organic medium will ordinarily constitute 5–50% wt. of the paste.

E. Sample Preparation

The following procedure was used to prepare small scale defogger circuits for evaluation in the following Examples:

1. Decorative enamel paste of either the solvent-based or UV-curable type is screen printed onto a flat glass substrate using a conventional screen, typically 156 or 195 mesh polyester.
2. The printed enamel pattern is dried at 150° C. for 15 minutes or UV cured at 1.2 $J/cm^2$ depending on the type of enamel.
3. The silver paste is screen printed onto either the airside or tinside of a flat glass substrate or onto unfired enamel using a conventional screen, typically 195 mesh polyester. Other meshes such as 156 and 230 mesh can be used with equal success.
4. The silver is fired or the silver and enamel are cofired in a belt furnace set to reach a peak glass surface temperature of 580° to 680° C.

F. Test Procedures

Resistance—The resistance of the silver paste was measured using a Hewlett Packard 3478A Multimeter. Sheet resistance was calculated in ohms per square by dividing resistance by the number of squares in the printed pattern. This number was 486 mm/0.76 mm=640 squares.

Color—The color of the glass stained by the silver paste was both visually observed and measured by colorimeter (X-Rite Model 918). The colorimeter was designed to calculate CIE L*a*b* coordinates from light reflected 45° from the inclident light beam sent through a 10° aperture. The incident light was set to the Daylight 6500K spectrum. Specular light was excluded from the measurement. A positive change in L or b indicates a change from a lighter color to a darker color. Color changes in which L or b are 1 or more are detectable by the unassisted human eye. Changes in L or b of less than 1 are usually not detectable by the unassisted human eye.

Adhesion—Copper clips were soldered to the fired silver paste on 3 mm thick glass substrates. Adhesion of the clip to the silver was measured using an Instron Model A2-140 tensile tester. Adhesion values greater than 40 pounds are preferred.

EXAMPLES

Examples 1-21

A series of twenty-one silver-containing thick film pastes was prepared to observe the compositional variables of the invention and to compare the compositions of the invention with conventional (standard) thick film pastes which are used for this purpose. The composition and fired properties of these pastes are given in Table 1, the data in which are organized in the following manner:

| Examples 1 and 2 | Standard paste printed on tin and air side respectively |
| --- | --- |
| Example 3 | Base paste #1 |
| Example 4–12 | Base paste #1 with various additives on air side |
| Example 13 | Base paste #2 |
| Examples 14–21 | Base paste #2 with various additives on air side |

The additives are listed in decreasing order of coloration efficacy with the exception of Example 21, which has a significantly different level of addition.

TABLE 1

Effects of Transition Metal Oxide Addition on the Properties of Automotive Glass Thick Film Pastes

| | Example No. | | | | | | |
| --- | --- | --- | --- | --- | --- | --- | --- |
| | 1 | 2 | 3 | 4 | 5 | 6 | 7 |
| Composition, % Wt. | | | | | | | |
| Description & Category | Color Std. | Std. on Air | Base 1 (B1) | B1 + Add | B1 + Add | B1 + Add | B1 + Add |
| Silver Powder | 70.6 | 70.6 | 70.8 | 70.8 | 70.8 | 70.8 | 70.8 |
| Proportion Submicron Ag | 0.0 | 0.0 | 0.3 | 0.3 | 0.3 | 0.3 | 0.3 |
| Lead Borosilicate Frit | 4.7 | 4.7 | 3.0 | 3.0 | 3.0 | 3.0 | 3.0 |
| Organic Medium | 24.7 | 24.7 | 25.6 | 22.6 | 22.6 | 22.6 | 22.6 |
| Additive Type | None | None | $Co_3O_4$ | $V_2O_5$ | $Co_3O_4$ | $MnO_2$ | $CuCr_2O_4$ |
| Additive Form | | | MO Powder | MO Powder | MO Powder | MO Powder | MO Powder |
| Additive Content | 0.0 | 0.0 | 0.6 | 3.0 | 3.6 | 3.0 | 3.0 |
| Second Additive Type | | | | $Co_3O_4$ | | $Co_3O_4$ | $Co_3O_4$ |
| Second Additive Content | | | | 0.6 | | 0.6 | 0.6 |
| Properties | | | | | | | |
| Color on Specified Side | Tinside | Airside | Airside | Airside | Airside | Airside | Airside |
| Peak Firing Temp. = 610 C. | | | | | | | |
| Description | Brown | Yellow | V. Lt. Brown | Brown | Brown | Brown | Lt. Brown |
| L* (0 = Black, 100 = White) | 20.2 | 34.5 | 26.5 | 16.4 | 17.3 | 18.7 | 20.7 |
| a* (red-green scale) | 16.9 | 9.4 | 7.2 | 15.1 | 6.0 | 7.5 | 8.7 |
| b* (yellow-blue scale) | 31.8 | 51.5 | 39.8 | 24.7 | 27.7 | 29.9 | 33.8 |
| Electrical Sheet R (mΩ/□) | 4.7 | 4.5 | 6.0 | 7.9 | 10.5 | 15.0 | 8.5 |
| Soldered Adhesion over Enamel (lb) | 67.5 | | 49.3 | 31.3 | 31.3 | 48.0 | 34.0 |
| Color on Specified Side | Tinside | Airside | Airside | Airside | Airside | Airside | Airside |
| Peak Firing Temp. = 640 C. | | | | | | | |
| Description | Lt. Brown | Yellow | V. Lt. Brown | Brown | Brown | Brown | Lt. Brown |
| L* (0 = Black, 100 = White) | 22.6 | 34.1 | 28.0 | 16.2 | 16.5 | 17.3 | 22.3 |
| a* (red-green scale) | 18.4 | 10.3 | 8.8 | 13.6 | 7.6 | 7.4 | 10.0 |
| b* (yellow-blue scale) | 37.3 | 53.3 | 45.1 | 25.4 | 27.5 | 28.1 | 36.2 |
| Electrical Sheet R (mΩ/□) | 4.4 | 4.3 | 6.5 | 7.6 | 10.5 | 14.8 | 8.5 |
| Soldered Adhesion over Enamel (lb) | 13.5 | | 36.0 | 52.5 | 23.3 | 37.0 | 34.8 |
| Color Shift | | | | | | | |
| ΔL* | | 2.4 | −0.4 | 1.5 | −0.2 | −0.8 | −1.4 | 1.6 |
| Δa* | | 1.5 | 0.9 | 1.6 | −1.5 | 1.6 | −0.1 | 1.3 |
| Δb* | | 5.5 | 1.8 | 5.3 | 0.7 | −0.2 | −1.8 | 2.4 |

| | Example No. | | | | | | |
| --- | --- | --- | --- | --- | --- | --- | --- |
| | 8 | 9 | 10 | 11 | 12 | 13 | 14 |
| Composition, % Wt. | | | | | | | |
| Description & Category | B1 + Add | B1 + Add | B1 + Add | B1 + Add | B1 + Add | Base 2 (B2) | B2 + Add |
| Silver Powder | 70.8 | 70.8 | 70.8 | 70.8 | 70.8 | 70.8 | 70.8 |
| Proportion Submicron Ag | 0.3 | 0.3 | 0.3 | 0.3 | 0.3 | 0.3 | 0.3 |
| Lead Borosilicate Frit | 3.0 | 3.0 | 3.0 | 3.0 | 3.0 | 3.0 | 3.0 |
| Organic Medium | 22.6 | 22.6 | 22.6 | 22.6 | 22.6 | 25.9 | 22.9 |
| Additive Type | $Fe_2O_3$ | NiO | $TiO_2$ | Co | Ni | None | $MnO_2$ |
| Additive Form | MO Powder | MO Powder | MO Powder | Metal Pwdr | Metal Pwdr | | MO Powder |
| Additive Content | 3.0 | 3.0 | 3.0 | 3.0 | 3.0 | 0.0 | 1.5 |
| Second Additive Type | $Co_3O_4$ | $Co_3O_4$ | $Co_3O_4$ | $Co_3O_4$ | $Co_3O_4$ | | $Co_3O_4$ |
| Second Additive Content | 0.6 | 0.6 | 0.6 | 0.6 | 0.6 | | 1.5 |
| Properties | | | | | | | |
| Color on Specified Side | Airside | Airside | Airside | Airside | Airside | Airside | Airside |
| Peak Firing Temp. = 610 C. | | | | | | | |
| Description | Lt. Brown | Lt. Brown | V. Lt. Brown | V. Lt. Brown | V. Lt. Brown | Dk. Yellow | Brown |
| L* (0 = Black, 100 = White) | 21.9 | 23.5 | 25.5 | 26.1 | 26.5 | 32.3 | 18.0 |
| a* (red-green scale) | 11.0 | 8.3 | 8.6 | 7.0 | 7.0 | 9.5 | 9.0 |
| b* (yellow-blue scale) | 34.0 | 36.9 | 39.4 | 39.9 | 39.7 | 44.0 | 28.5 |
| Electrical Sheet R (mΩ/□) | 10.5 | 9.5 | 8.0 | 8.3 | 8.3 | 5.7 | 14.4 |
| Soldered Adhesion over Enamel (lb) | 26.3 | 34.5 | 36.3 | 33.5 | 46.3 | 45.3 | 34.0 |
| Color on Specified Side | Airside | Airside | Airside | Airside | Airside | Airside | Airside |
| Peak Firing Temp. = 640 C. | | | | | | | |
| Description | Lt. Brown | Lt. Brown | Lt. Brown | V. Lt. Brown | V. Lt. Brown | Yellow | Brown |
| L* (0 = Black, 100 = White) | 22.0 | 23.9 | 24.0 | 27.7 | 27.7 | 31.9 | 17.3 |
| a* (red-green scale) | 11.3 | 9.4 | 10.0 | 8.2 | 8.3 | 11.1 | 9.7 |
| b* (yellow-blue scale) | 35.3 | 38.7 | 39.1 | 44.0 | 44.0 | 48.9 | 28.4 |
| Electrical Sheet R (mΩ/□) | 10.3 | 9.5 | 8.5 | 8.3 | 8.3 | 5.8 | 13.3 |

TABLE 1-continued

Effects of Transition Metal Oxide Addition on the Properties of Automotive Glass Thick Film Pastes

| | | | | | | | |
|---|---|---|---|---|---|---|---|
| Soldered Adhesion over Enamel (lb) | 25.0 | 43.3 | 31.0 | 32.8 | 43.5 | 48.3 | 25.5 |
| Color Shift | | | | | | | |
| $\Delta L^*$ | 0.1 | 0.4 | −1.5 | 1.6 | 1.2 | −0.4 | −0.7 |
| $\Delta a^*$ | 0.3 | 1.1 | 1.4 | 1.2 | 1.3 | 1.6 | 0.7 |
| $\Delta b^*$ | 1.3 | 1.8 | −0.3 | 4.1 | 4.3 | 4.9 | −0.1 |

| | Example No. | | | | | | |
|---|---|---|---|---|---|---|---|
| | 15 | 16 | 17 | 18 | 19 | 20 | 21 |
| Composition, % Wt. | | | | | | | |
| Description & Category | B2 + Add | B2 + Add | B2 + Add | B2 + Add | B2 + Add | B2 + Add | B2 + Add |
| Silver Powder | 70.8 | 70.8 | 70.8 | 70.8 | 70.8 | 70.8 | 70.8 |
| Proportion Submicron Ag | 0.3 | 0.3 | 0.3 | 0.3 | 0.3 | 0.3 | 0.3 |
| Lead Borosilicate Frit | 3.0 | 3.0 | 3.0 | 3.0 | 3.0 | 3.0 | 3.0 |
| Organic Medium | 22.9 | 22.9 | 22.9 | 22.9 | 24.9 | 22.9 | 15.9 |
| Additive Type | $MnO_2$ | $V_2O_5$ | $Ag_2SO_4$ | $MnO_2$ | $MnO_2$ | $TiO_2$ | $MnO_2$ |
| Additive Form | MO Powder | MO Powder | Powder | MO Powder | MO Powder | MO Powder | MO Powder |
| Additive Content | 3.0 | 3.0 | 3.0 | 1.5 | 1.0 | 3.0 | 10.0 |
| Second Additive Type | | | | $TiO_2$ | | | |
| Second Additive Content | | | | 1.5 | | | |
| Properties | | | | | | | |
| Color on Specified Side | Airside | Airside | Airside | Airside | Airside | Airside | Airside |
| Peak Firing Temp. = 610 C. | | | | | | | |
| Description | Brown | Brown | Brown | Brown | Lt. Brown | V. Lt. Brown | Dr. Brown |
| $L^*$ (0 = Black, 100 = White) | 18.2 | 18.4 | 19.4 | 19.9 | 24.2 | 25.6 | 10.0 |
| $a^*$ (red-green scale) | 9.0 | 15.8 | 16.4 | 12.4 | 10.5 | 13.8 | 9.8 |
| $b^*$ (yellow-blue scale) | 28.2 | 27.1 | 31.3 | 32.3 | 36.9 | 41.3 | 17.2 |
| Electrical Sheet R (m$\Omega$/□) | 13.2 | 8.4 | 6.0 | 12.4 | 9.8 | 9.1 | 30.3 |
| Soldered Adhesion over Enamel (lb) | 46.0 | 54.0 | 58.3 | 39.0 | 49.8 | 41.0 | 16.8 |
| Color on Specified Side | Airside | Airside | Airside | Airside | Airside | Airside | Airside |
| Peak Firing Temp. = 640 C. | | | | | | | |
| Description | Brown | Lt. Brown | Lt. Brown | Brown | V. Lt. Brown | V. Lt. Brown | Dr. Brown |
| $L^*$ (0 = Black, 100 = White) | 17.2 | 20.0 | 21.8 | 20.1 | 26.6 | 26.4 | 9.9 |
| $a^*$ (red-green scale) | 11.2 | 16.3 | 17.8 | 12.6 | 11.2 | 13.7 | 8.1 |
| $b^*$ (yellow-blue scale) | 28.2 | 33.3 | 36.4 | 33.8 | 41.2 | 42.8 | 15.9 |
| Electrical Sheet R (m$\Omega$/□) | 11.9 | 7.6 | 5.6 | 11.7 | 9.6 | 8.7 | 28.2 |
| Soldered Adhesion over Enamel (lb) | 41.3 | 48.5 | 49.5 | 25.3 | 48.5 | 31.8 | 17.5 |
| Color Shift | | | | | | | |
| $\Delta L^*$ | −1.0 | 1.6 | 2.4 | 0.2 | 2.4 | 0.8 | −0.1 |
| $\Delta a^*$ | 2.2 | 0.5 | 1.4 | 0.2 | 0.7 | −0.1 | −1.7 |
| $\Delta b^*$ | 0.0 | 6.2 | 5.1 | 1.5 | 4.3 | 1.5 | −1.3 |

Color Standard and Base Pastes

Examples 1 and 2 demonstrate the effect of glass orientation on the fired proper-ties of unstained silver defogger paste. The paste of Example 1, which was applied to the tin side of the glass, had the desired brown color seen on many automobiles. However, the paste of Example 2, which was applied to the air side of the glass, had only a yellow color. It will be noted that both base pastes, Examples 3 and 13, had a darker color than that of Example 2. This was due to the fact that a different silver powder type was used in both pastes and, in addition, $Co_3O_4$ was added to Example 3.

Effective Colorants

The pastes of Examples 5-8 and 14-18 all had equivalent or darker color than Example 1 and are therefore suitable for use as defogger pastes on the air side of automotive glass. The more effective colorants were $Co_3O_4$, $MnO_2$ and $V_2O_5$. Though $Fe_2O_3$ provided adequate coloration to the pastes, it was not as effective as the other three metal oxides.

NiO and TiO2 Additions

Examples 11 and 12 show clearly that the addition of NiO and $TiO_2$ in the concentrations shown had no effect on color of the fired pastes. From this it is obvious that much higher concentrations of these metal oxides would be needed to match the color of the standard pastes.

Prior Art Colorants

Examples 7 and 17 illustrate the current colorant technology for defogger pastes in which $CuCr_2O_4$ serves as a black pigment with moderate efficacy and $Ag_2SO_4$ serves as a source of mobile $Ag^+$ ions that diffuse into the glass.

There are several disadvantages with the current technology:

(1) Both Examples 7 and 17 show a noticeable firing temperature dependence of color. This is seen in the Color Shift section of the table which lists change in $L^*$, $a^*$ and $b^*$ values with firing temperature. Any change of absolute value greater than 1.0 of $L^*$ and $b^*$ is visible to the unassisted eye. A larger magnitude change of $a^*$ is needed for visible effect.

(2) The sulfate salt reacts with the window glass to form $Na_2SO_4$ which forms an unappealing salt scale after exposure to moisture.

Color as a Function of Firing Temperature

Examples 4, 5, 8, 14 and 21 each exhibited a low magnitude color shift which varied with firing temperature. However, this color shift would be practically unnoticeable. In all but one of these compositions, $Co_3O_4$ was present, which had the effect of reducing the color shift of the other colorants such as $V_2O_5$ and $MnO_2$ when it was combined with them. In this regard, compare the paste of Example 4 with the paste of Example 16. Also compare the paste of Example 14 with the paste of Example 15.

Effect of Colorants on Resistance

The above data show that all of the tested colorants, except the $Ag_2SO_4$, incurred an increase in the resistance of the fired conductor pattern. In order of ascending effect on resistance, the colorants of the invention are $V_2O_5$, $Co_3O_4$, $Fe_2O_3$, and $MnO_2$. The use of mixtures of colorants appeared to have little effect on this phenomenon.

Effect of Colorants on Soldered Adhesion

Adhesion decreases with the use of the following additives: $Co_3O_4$, $Fe_2O_3$, $CuCr_2O_4$, $TiO_2$ and Co metal. Those additives that did not decrease adhesion at the 3% level were $MnO_2$, $V_2O_5$, $Ag_2SO_4$ and Ni metal. NiO either increased or decreased adhesion depending on firing temperature. Equal additions of $MnO_2$ to $Co_3O_4$ (Example 14) and to $TiO_2$ (Example 18) did not improve adhesion. Low level addition Of $Co_3O_4$ could be combined with higher level addition Of $V_2O_5$ (Example 4) and $MnO_2$ (Example 6) without decreasing adhesion.

Effect of Colorant Concentration

Examples 19, 15 and 21 illustrate the effect of increasing $MnO_2$ addition to silver paste. Increasing concentration magnified the additive's effects on color, R and adhesion. The 10% $MnO_2$ paste had very dark fired color, good color temperature dependence, high R and reduced adhesion.

We claim:

1. A thick film paste composition for applying conductive patterns to automotive window glass comprising finely divided particles of (a) metallic silver, (b) a mixture of high and low melting point glass frits having melting points which differ by at least 100° C. and having a total softening point of 350°–620° C. wherein the glass frits are lead silicate glasses or lead borosilicate glasses or mixtures thereof, and (c) 1–6% wt., basis paste, of an oxide of a transition metal selected from V, Mn, Fe, Co and mixtures thereof, all of (a), (b) and (c) being dispersed in (d) and organic medium, with the proviso that the valence of the transition metal is higher than 2.

2. The composition of claim 1 in which the transition metal oxide is selected from $Mn_2O_3$, $MnO_2$, $Co_3O_4$, $V_2O_5$ and mixtures thereof.

* * * * *